(12) United States Patent  
Eiselt et al.

(10) Patent No.: US 9,166,695 B2  
(45) Date of Patent: Oct. 20, 2015

(54) OPTICAL FREQUENCY LOCKING METHOD AND DEVICE FOR OPTICAL DATA TRANSMISSION

(75) Inventors: Michael Eiselt, Kirchheim (DE); Markus Roppelt, Karlsruhe (DE)

(73) Assignee: ADVA Optical Networking SE, Meiningen (DE)

( * ) Notice: Subject to any disclaimer, the term of this patent is extended or adjusted under 35 U.S.C. 154(b) by 443 days.

(21) Appl. No.: 13/610,575

(22) Filed: Sep. 11, 2012

(65) Prior Publication Data

US 2013/0064542 A1    Mar. 14, 2013

(30) Foreign Application Priority Data

Sep. 12, 2011    (EP) ..................................... 11401589

(51) Int. Cl.
| | |
|---|---|
| H04B 10/04 | (2006.01) |
| H04B 10/50 | (2013.01) |
| H01S 5/0687 | (2006.01) |
| H04B 10/079 | (2013.01) |
| H04B 10/572 | (2013.01) |
| H01S 5/06 | (2006.01) |
| H01S 5/40 | (2006.01) |

(52) U.S. Cl.
CPC ............ *H04B 10/506* (2013.01); *H01S 5/0687* (2013.01); *H04B 10/0797* (2013.01); *H04B 10/572* (2013.01); *H01S 5/0617* (2013.01); *H01S 5/4025* (2013.01)

(58) Field of Classification Search
CPC .. H04B 10/572; H04B 10/675; H04B 10/506; H04B 10/5057; H04B 10/564; H04B 10/58; H04B 10/50; G01J 9/04; H04J 14/02; H01S 5/0687; H01S 5/068; H01S 5/0683

USPC ......... 398/137, 162, 195, 69, 79, 187, 34, 25, 398/136, 158, 192, 194, 196, 197

See application file for complete search history.

(56) References Cited

U.S. PATENT DOCUMENTS

| | | | | |
|---|---|---|---|---|
| 6,233,261 | B1 * | 5/2001 | Mesh et al. | 372/29.012 |
| 6,396,603 | B1 * | 5/2002 | Kim | 398/91 |
| 6,603,781 | B1 * | 8/2003 | Stinson et al. | 372/23 |
| 6,785,306 | B2 * | 8/2004 | Kai et al. | 372/20 |
| 7,068,949 | B2 * | 6/2006 | Jung et al. | 398/195 |

(Continued)

FOREIGN PATENT DOCUMENTS

| | | |
|---|---|---|
| EP | 2 290 852 A2 | 3/2011 |
| WO | WO 2007/005755 A1 | 1/2007 |

*Primary Examiner* — Hibret Woldekidan  
(74) *Attorney, Agent, or Firm* — The Culbertson Group, P.C.

(57) ABSTRACT

An optical frequency locking method tunes each of a plurality of narrow-band optical channel transmit signals (having arbitrary channel frequency spacings) to a dedicated optical channel frequency. The method includes tapping-off a portion of the optical power of the respective channel transmit signal and filtering the tapped-off channel transmit signal using at least one optical filter device. The method also includes monitoring, as an optical input signal, the optical power of the respective channel transmit signal supplied to the at least one optical filter device and, as an optical output signal, the optical power of the filtered channel transmit signal. The method further includes tuning, within a predetermined locking range for the dedicated optical channel frequency, the optical frequency of the respective channel transmit signal such that a predetermined value for the ratio of the output signal and the input signal is reached.

12 Claims, 6 Drawing Sheets

(56) References Cited

U.S. PATENT DOCUMENTS

| | | | |
|---|---|---|---|
| 7,379,672 B2 * | 5/2008 | Wang et al. | 398/115 |
| 8,190,033 B2 * | 5/2012 | Tu | 398/196 |
| 8,311,750 B2 * | 11/2012 | Taylor | 702/19 |
| 8,364,045 B2 * | 1/2013 | Ishikawa et al. | 398/196 |
| 8,543,004 B2 * | 9/2013 | Eiselt | 398/137 |
| 8,611,750 B2 * | 12/2013 | Lei et al. | 398/95 |
| 8,670,665 B2 * | 3/2014 | Toyomaki et al. | 398/32 |
| 8,693,867 B2 * | 4/2014 | Littler et al. | 398/32 |
| 8,693,872 B2 * | 4/2014 | Wu et al. | 398/79 |
| 8,705,952 B2 * | 4/2014 | Grobe et al. | 398/7 |
| 8,781,327 B2 * | 7/2014 | Shen et al. | 398/79 |
| 8,934,787 B2 * | 1/2015 | Shen et al. | 398/195 |
| 8,981,273 B2 * | 3/2015 | Kuo | 250/205 |
| 2003/0112836 A1 * | 6/2003 | Kim et al. | 372/18 |
| 2003/0185259 A1 * | 10/2003 | Gamache et al. | 372/32 |
| 2009/0232493 A1 * | 9/2009 | Tu | 398/17 |
| 2012/0251122 A1 * | 10/2012 | Grobe et al. | 398/95 |
| 2014/0064734 A1 * | 3/2014 | Witzens | 398/79 |
| 2014/0247840 A1 * | 9/2014 | Eiselt et al. | 370/535 |

\* cited by examiner

OPTICAL FREQUENCY LOCKING METHOD AND DEVICE FOR OPTICAL DATA TRANSMISSION

TECHNICAL FIELD OF THE INVENTION

The invention relates to an optical frequency locking method for tuning each of a plurality of narrow-band optical channel transmit signals to a dedicated optical channel frequency, the channel transmit signals having arbitrary channel frequencies within a transmission band spectrum. Further, the invention relates to an optical wavelength-locking device adapted to realize the corresponding method.

BACKGROUND OF THE INVENTION

In most optical data transmission applications using optical wavelength division multiplexing (WDM), the wavelengths of the optical transmitters (mostly lasers) need to be locked to dedicated channel wavelengths, for example according to the ITU wavelength grid with optical frequencies spaced by 100, 50, or 25 GHz. For this purpose, wavelength lockers are available using optical filter devices, like etalons, which are periodic with the ITU frequency spacing. The known methods for locking the wavelength or optical frequency of a transmit signal to a dedicated channel frequency use a fixed relative position of the periodical optical transfer function of an optical filter device in order to lock the frequency of the transmitter unit to a fixed position of the respective transmission band of the filter. This fixed position usually corresponds to a mid point between the minimum and the maximum point of the filter transfer characteristic.

However, in some applications, optical wavelengths or optical frequencies for the channel transmit signals are required, which do not match the ITU grid. An example of such an application is a data transmission system using a cyclic arrayed waveguide grating (cyclic AWG) for demultiplexing an optical WDM signal comprising optical channel signals lying in one optical band (for example the L-band) and multiplexing channel transmit signals guided in the opposite transmission direction and lying in another optical band (for example the C-band). In this case, the cyclic AWG may be used for demultiplexing the WDM receive signal and multiplexing the channel transmit signals into a WDM transmit signal, if the channel receive signals and the channel transmit signals are spaced by a multiple integer of the free spectral range (FSR) of the cyclic AWG, that is, in different refractive orders of the cyclic AWG. As, due to physical properties of a cyclic AWG, the frequency spacing in different, even neighboring orders is slightly different, the frequency spacing of the downstream and upstream channels is different, too. In such applications, the intrinsic frequency spacing of the channel signals for the upstream or downstream direction differs from the ITU spacing by a few GHz, even if the channel signals for the respective other direction match the ITU spacing. Another example, where channel frequencies are required which do not fit the ITU grid, is the choice of unequal channel spacing to combat the non-linear effect of four-wave mixing. Here, three optical signals in a WDM system at frequencies f1, f2, and f3 interact during transmission in a non-linear fiber, generating new signals at, for instance, f1+f2−f3. If the frequencies adhere to a fixed frequency grid, the generated new signal is likely to interfere with a further signal of the WDM system. Using frequencies in the WDM system which do not have a fixed frequency spacing reduces the distortion from four-wave mixing, as most mixing products fall between the data carrying channels. This application is known as unequal channel spacing. For this application, it is necessary to control the transmit lasers to arbitrary frequencies.

Unfortunately, wavelength-locking devices for arbitrary but fixed absolute frequencies and arbitrary but fixed frequency spacings are not readily commercially available, or they are prohibitively costly as it is necessary to manufacture optical filter devices having a periodicity matching the required frequency spacing in rather low numbers.

Of course, it would be possible to use optical filter devices having a periodical transfer function, which are tunable with respect to the absolute position of the transmission bands (or peaks) and with respect to the spacing of the bands (or peaks), like a tunable delay-line interferometer. However, in case of a tunable delay-line interferometer, the absolute frequency and the frequency spacing of the transmission bands (or peaks) strongly varies with temperature, so the temperature of such a device needs to be precisely controlled during operation. Alternatively, a control signal having a fixed wavelength or optical frequency may be used to control the frequency grid of the interferometer. However, both variants require additional effort and costs.

It is therefore an object of the present invention to provide a frequency locking method for tuning each of a plurality of narrow-band optical channel transmit signals to a dedicated optical channel frequency, the channel transmit signals having arbitrary channel frequency spacings, which allows the use of readily available optical filter devices having a transfer function with a different periodicity. It is a further object of the invention to provide a wavelength-locking device adapted to realize the method according to the invention.

SUMMARY OF THE INVENTION

The present invention enables the control of off-grid wavelengths or optical frequencies by using at least one on-grid optical filter device, which is available thermally stable and at relatively low costs. Also readily available on-grid wavelength-locking devices comprising an optical filter device (like a Fabry-Perot interferometer) and two detector means may be used, in which one detector means (e.g. a photodiode) detects the input optical power of a narrow-band optical channel transmit signal, and the other detector (e.g. a second photodiode) detects the power of the signal having passed through the Fabry-Perot interferometer (i.e. the filtered optical channel transmit signal). If the frequency of the channel transmit signal is on-grid, i.e., if the frequency equals a dedicated channel frequency, the ratio of the powers detected by the detector means has a predetermined value. This value of the ratio (target ratio) may be determined (measured or calculated) for each of the dedicated channel frequencies (which may, for example, be the frequencies of the ITU frequency grid), preferably before turning on the transmission system. If this ratio is smaller (larger) than the pre-determined value, the frequency is too low (too high) and needs to be tuned upwards (downwards). Depending on the slope of the optical filter device transfer characteristic at the grid frequencies (i.e. the dedicated channel frequencies), this tuning algorithm might be inverted.

As already mentioned, the channel transmit frequencies of the channel transmit signals reveal channel frequency spacings (i.e. the frequency distance between two neighboring channel transmit signals) which are not all essentially equal to the periodicity of the transfer function of the at least one optical filter device. It lies within the scope of the present invention if at least one channel frequency spacing is different from the periodicity of the at least one filter device. Of course, all channel frequency spacings of the channel transmit signals may be different from the periodicity of the at least one filter device. In one embodiment of the invention, the frequency spacings of the channel transmit signals may be essentially identical but different from the periodicity of the transfer function of the at least one optical filter device.

According to an embodiment of the invention, the optical frequency of the channel transmit signal is tuned to an initial value lying within said predetermined locking range for the dedicated optical channel frequency.

As already mentioned, this target ratio is preferably determined before turning on the system. It remains constant for a given type of wavelength-locking device and can either be measured or calculated ahead of time, using the transfer characteristics of the optical filter device and the optical frequency or frequency spectrum of the optical transmitter units.

Another preferred solution utilizes at least one further on-grid optical filter device and at least one further detector means for detecting the power of the filtered transmit signal. In order to detect the optical power of the filter input signal, the same detector means may be used as for detecting the filter input signal of the first optical filter device, even if an optical splitter unit is used to split the transmit signal that is tapped off from the data transmission path into two or three signals (one supplied to the signal input detector means and each of the remaining two signals to the respective one of the two filter devices). The constant factor that takes into account the splitting ratio of the splitter unit can be taken into account when calculating the target ratio.

The transfer function of the at least one further on-grid optical filter device preferably reveals the same periodicity and is shifted by a predetermined phase shift versus the transfer function of the first optical filter device. In this way, it can be achieved that, if the target frequency is near the minimum or maximum of the first optical filter device transfer function, the target frequency is on one of the slopes (aside from the minimum or maximum) of the further optical filter device transfer function, so that the further optical filter device (and a respective target ratio for the respective dedicated channel frequency for this further filter device) can be used for the frequency locking.

This method achieves a minimum locking range, which is typically larger than a quarter of the filter periodicity. This locking range can further be improved using the same devices, by comparing the ratio of the detected power values after the at least two optical filter devices and comparing this value to a value which would be detected when the signal is at the target frequency. To maximize the minimum locking range, for each target optical frequency the tuning method is determined (ratio of filter 1, ratio of filter 2, or ratio between filter 1 and filter 2).

According to a further embodiment of the invention, the predetermined locking range can be defined by determining a first spectral distance between the dedicated channel frequency and a first neighboring point at a lower frequency having the same value of the ratio of the optical output and input signal as the value of the predetermined ratio and determining a second spectral distance between the dedicated channel frequency and a second neighboring point at a higher frequency having the same value of the ratio of the optical output and input signal as the value of the predetermined ratio. As locking range the whole range between the first and second neighboring points may be used, or the range between the frequencies defined by the dedicated channel frequency plus and minus the smaller one of the first and second spectral distances.

Of course, it would also be possible to use as locking range the spectral range in which the target value of the ratio for the respective optical filter device lies and in which the ratio reveals a monotonously decreasing or increasing behavior. In other words, the locking range lies within the range between two neighboring extreme values (maximum and minimum) for the ratio which includes the target value.

If more than one optical filter device is used, the selection of the optical filter device to be used for tuning a selected one of the channel transmit signals can be made by determining for all optical filter devices, preferably during a calibration process or by calculation, the locking range (especially according to the two last mentioned alternatives) and using the filter device and the respective input and output signal, respectively, for the locking mechanism that ensures the maximum locking range for the channel transmit signal to be tuned.

Alternatively, the optical power of the tapped-off channel transmit signal filtered by a first optical filter device may be monitored as a first optical output signal, and the optical power of the tapped-off channel transmit signal filtered by a second optical filter device may be monitored as a second optical output signal. The optical frequency of the respective channel transmit signal may then be tuned, within a predetermined locking range, such that a predetermined value of the ratio of the first and second output signals corresponding to the dedicated optical channel frequency is reached.

In this alternative, a first spectral distance between the dedicated channel frequency and a first neighboring point at a lower frequency having the same value of the ratio of the first and second optical output signals as the value of the predetermined ratio may be determined as well as a second spectral distance between the dedicated channel frequency and a second neighboring point at a higher frequency having the same value of the ratio of the first and second optical output signals as the value of the predetermined ratio. As a locking range, the whole range between the first and second neighboring points may be used or the range between the frequencies defined by the dedicated channel frequency plus and minus the smaller one of the first and second spectral distances.

In certain frequency ranges, using the ratio of two output signals for the tuning process is advantageous as a larger locking range is provided as compared to the use of the transfer functions of the at least two filter devices.

According to another embodiment of the invention, a plurality of channel transmit signals may be combined within a single WDM transmit signal that is used for tapping off one or more WDM transmit signals in order to monitor the input and output signals, wherein the channel transmit signal to be tuned is amplitude-modulated with a given low modulation frequency (small versus the bitrate) and a given predetermined small modulation depth and wherein the input and output signals are detected in a phase sensitive manner.

These and other advantages and features of the invention will be apparent from the following description of the preferred embodiments, considered along with the accompanying drawings.

BRIEF DESCRIPTION OF THE DRAWINGS

In the following, the invention will be described with reference to the embodiments apparent from the drawings in which.

DESCRIPTION OF ILLUSTRATIVE EMBODIMENTS

Figure 1:
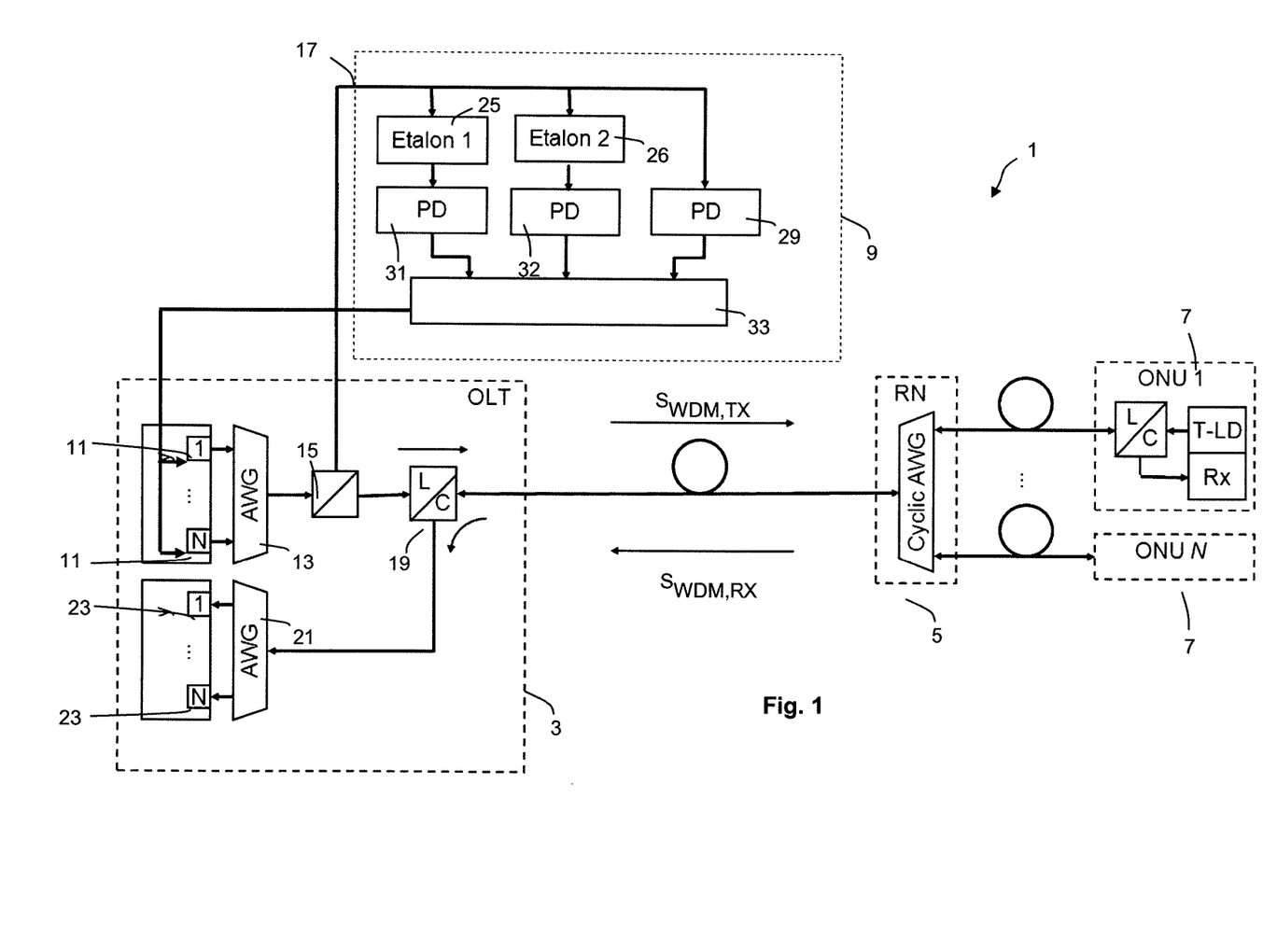
FIG. 1 comprises a schematic block diagram of a fiber-optic data transmission system using a PON (passive optical network) including an optical frequency locking device according to an embodiment of the invention using two optical filter devices.

FIG. 1 shows a part of a complex fiber-optic data transmission system 1 comprising a central node in the form of an optical line terminal OLT, also designated by reference numeral 3, a remote node RN, also designated by reference numeral 5 and a number of N optical node units ONU 1 to ONU N, also designated by reference numerals 7, which may be provided at the customer locations. Further, the system includes an optical frequency locking device 9 that might be included within the OLT 3.

The OLT 3 includes an array of N tunable optical transmitter units 11, each being adapted to create an optical channel transmit signal at a given wavelength or optical frequency (due to the narrow optical spectrum of the transmit signals the term "(optical) frequency" will be used throughout the following description). The optical transmitter units 11 are preferably realized as laser diodes. The optical transmit signals created by the optical transmitter units 11 lie within a predetermined frequency band, for example the L-band, and reveal, in this embodiment, a given fixed frequency spacing, for example according to the standardized ITU grid (100 GHZ, 50 GHz or 25 GHz, respectively). An optical multiplexing device 13 is provided that receives the optical transmit signals at a respective one of N input ports and multiplexes the channel transmit signals into a WDM transmit signal $S_{WDM,TX}$, which is output at a multiplex port of the multiplexing device 13. The multiplexing device may be realized as an AWG. A predefined (small) power portion of the WDM transmit signal is tapped off by an optical 1×2 splitter 15 which lies within the optical path of the WDM transmit signal. One splitting port of the optical splitter 15 is connected to an input port 17 of the optical frequency locking device 9. The other splitting port of the optical splitter 15 is connected to the L-band port of a band splitter 19 which is adapted to combine/separate the optical path for the WDM transmit signal $S_{WDM,TX}$ transmitted from the OLT 3 to the RN 5 and the optical path for a WDM receive signal $S_{WDM,RX}$ created by the ONUs and transmitted from the RN 5 to the OLT 3. The channel signals created by the ONUs lie within another band than the channel transmit signals created by the transmitter units 11 of the OLT 3, for example with the optical C-band. Moreover, the corresponding channel signals for establishing a bidirectional transmission link between the OLT 3 and a given ONU reveal a frequency spacing being an integer multiple of the free spectral range of a cyclic AWG included within the RN 5.

In this way, a single cyclic AWG (at RN5) may be used as multiplexing/demultiplexing device for demultiplexing the WDM transmit signal $S_{WDM,TX}$ and for multiplexing the channel signals created by the ONUs, which are received at dedicated multiplexing ports of the cyclic AWG into the WDM receive signal $S_{WDM,RX}$, which is output at a multiplex port of the cyclic AWG, which is connected to a common port of the band splitter 19 included within the OLT 3.

The band splitter 19 outputs the WDM receive signal $S_{WDM,RX}$ at a C-band port which is connected to the multiplex port of a further AWG 21 having N demultiplex ports, each being connected to a receiver unit 23. Like the transmitter units 11, the receiver units 23 may be realized as an array of receiver units.

Due to physical properties of the cyclic AWG of the RN 5, the frequency spacing of transmission bands in the fundamental and higher refractive orders deviate from each other to a given extent. In the following, it is assumed that a cyclic AWG is used having a frequency spacing of 100 GHZ between the transmission bands of the fundamental refractive order (or a given order N) and a frequency spacing of 97.5 GHZ in the first refractive order (or a given neighboring order N+1). The fundamental refractive order (or the order N) may be used for multiplexing the channel signals created by the ONUs which shall be assumed to be spaced apart by 100 GHz. The first refractive order (or the order N+1) of the cyclic AWG is used to demultiplex the channel signals included within the WMD transmit signals $S_{WDM,TX}$ which, therefore, must be spaced apart by 97.5 GHz (in practice, an order in the region of N=40 is used).

It is thus necessary to tune the lasers or optical transmitter units 11 such that the channel transmit signals created by the individual transmitter units 11 match the optical frequency grid defined by the first refractive order of the cyclic AWG. For this purpose, the tapped-off power portion of the WDM transmit signal $S_{WDM,TX}$ is supplied to the input port 17 of the frequency locking device 9, which comprises at least one optical filter device 25 having a periodical filter transfer function with a fixed, constant frequency spacing. Such filter devices are only readily available at reasonably low costs for frequency spacings as defined by the respective ITU standards, as only such filter devices are produced in high numbers.

Thus, it will be explained in the following how an optical filter device 25 having a frequency spacing off the grid that is requested for the optical transmit channel signals may be used in order to enable frequency locking, that is, tuning the transmitter units 11 such that the optical frequencies of the signals match the dedicated channel frequencies.

Figure 2:
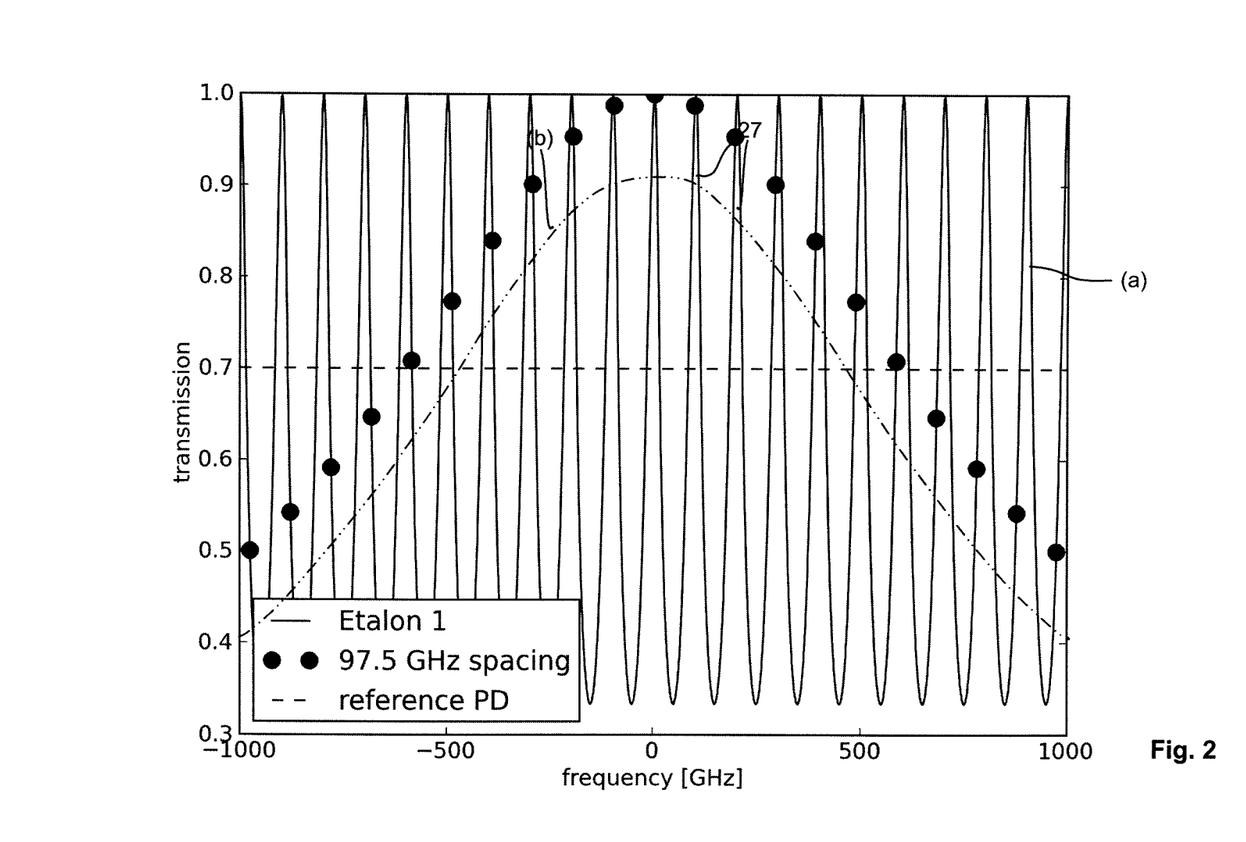
FIG. 2 comprises a diagram showing the normalized periodical transfer function of an optical filter device of a frequency locking device similar to the device shown in FIG. 1 which uses a single optical filter device, only, and the points according to dedicated channel frequencies having a constant frequency spacing slightly different from the periodicity of the transfer function.

FIG. 2 shows the normalized filter transfer function (curve (a)) for an optical filter device 25, for example a Fabry-Perot filter or Etalon, having a periodicity of 100 GHz. The filter transfer function is defined by the ratio of the optical power of the filter output signal and the filter input signal. The points 27 mark the points of the transfer function at the dedicated channel frequencies defined by the grid of the first refractive order of the cyclic AWG having a frequency spacing of 97.5 GHz. As this frequency spacing is different from the periodicity of the filter transfer function, the points 27 do not lie on a line parallel to the frequency axis but on the curve (b) connecting the points (this curve may be calculated using a nonlinear interpolation method).

The transfer function may thus be used to calculate, for each of the dedicated channel frequencies that are to be matched by the channel transmit signals, a value of the transfer function, i.e., a (target) ratio of the filter output signal and the filter input signal. For calculating this value, the spectrum of the respective transmit signal may be taken into account. For simplicity, the spectral broadness of the transmit signal may (at least for narrow-band signals) be neglected and the respective point of the (calculated) transfer function may be used as a target ratio for controlling the respective transmitter unit such that the optical frequency of the transmitter unit is tuned to a value at which the target ratio is reached exactly or at least with a sufficient accuracy.

Of course, curve (a) may also be replaced by a measured curve using a tunable transmit unit that may be tuned over the whole interesting range. For this measurement, an optical reference detector 29 of the optical frequency locking device 9 detecting a predetermined portion of the optical power of the tapped-off channel transmit signal received at the input port 17 and a further optical detector 31 comprised within the optical frequency locking device 9 detecting a given power portion of the optical transmit signal supplied to and filtered by the optical filter device 25 may be used.

As shown in FIG. 1, the channel transmit signal received at port 17 of the locking device 9 is split into three signals, preferably having equal power portions, two of which are supplied to the optical filter device 25 and a further optical filter device 26. For splitting the tapped-off signal, an optical 1×3 splitter (not shown) or any other splitter means providing the desired signal splitting (like cascaded 1×2 couplers) may be used. As the splitting ratio is constant and essentially wavelength-independent over the interesting range, the ratio of the input and output signal (which equals the corresponding value of the transfer function, if a narrow-band signal is used) merely has to take into account this constant factor.

The embodiment of an optical frequency locking device shown in FIG. 1 uses, as mentioned above, two optical filter devices 25, 26. The optical power of the filtered signal output by the filter device 25 is detected by the optical detector 31, and the optical power of the filtered signal output by the filter device 26 is detected by a further optical detector 32. All optical detectors 29, 31, 32 may comprise a broad-band photodiode. Each optical detector 29, 31, 32 creates an electrical signal that is supplied to a controller device 33.

The controller device 33 is adapted to receive and process the detector signals. It calculates the ratios of the actual values of the output signals and input signals for each of the optical filter devices used for the tuning of the transmitter units 11. The controller device 33 may further include a storage (not shown separately), or may be associated with separate storage, for storing the target ratios of the output and input signals for each optical filter device 25, 26. The controller device 33 creates a frequency control signal $S_f$ for controlling the respective transmitter unit 11 according to a given tuning algorithm. Suitable tuning algorithms are well-known and shall not be further discussed within this description.

Figure 3:
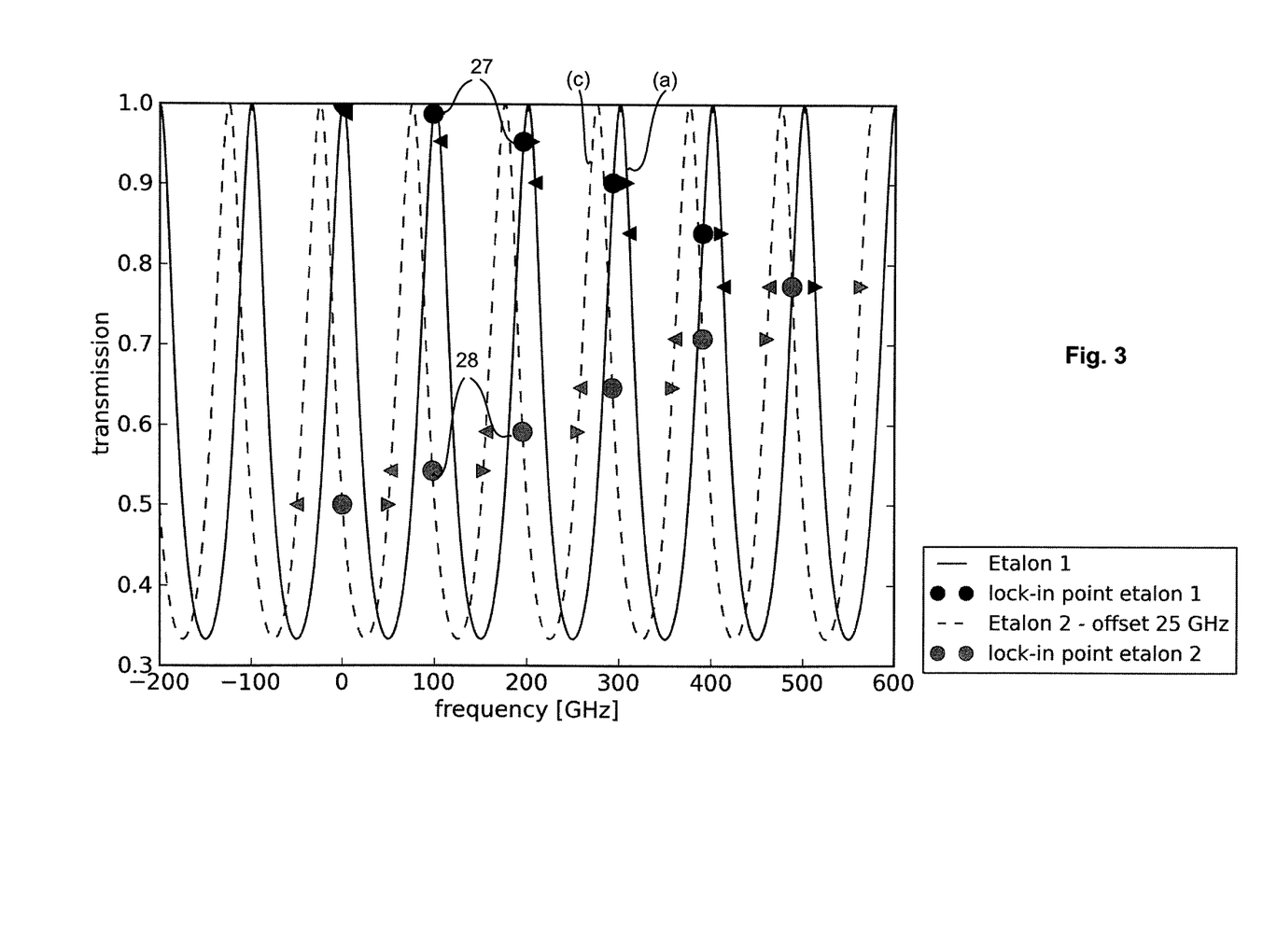
FIG. 3 comprises a diagram similar to FIG. 2, showing the transfer functions of the two optical filter devices of the embodiment of an optical frequency locking device according to FIG. 1; the two optical filter devices of this embodiment having transfer functions revealing the same periodicity but being shifted by a quarter of the period, FIG. 4 comprises a diagram illustrating the advantageous choice of the optical filter device to be used for the tuning of a selected channel transmit signal.

FIG. 3 shows, for a smaller number of channels, the transfer function of the optical filter device 25 (curve (a)) and the transfer function of the optical filter device 26 (curve (c)). For both curves, the target ratios for the dedicated channel frequencies are shown by respective points 27 and 28. The triangles left and right of a point 27, 28 designate the directly neighboring points of the respective transfer function (a), (c) having the same value as the respective point or target value. Within the frequency range of the two triangles, the target value is unique and may thus be reached by using a suitable tuning algorithm. The smaller frequency spacing of the spacings between the points 27, 28 and each of the respective point marked by the triangles may be used to define a symmetric locking range by adding and subtracting the smaller absolute value of the two distances to and from the frequency of the respective target point (i.e. the respective dedicated channel frequency). As is apparent from FIG. 3, the locking range defined in this way becomes small within the neighborhood of the extreme values (and may even be zero, if the target value is the extreme value) and is large within a given range between the extreme values.

As shown in FIG. 3, the transfer functions (a) and (c) of the filter devices 25, 26 reveal an identical periodicity but are shifted versus each other by ¼ of the frequency spacing or 25 GHz. In this way, it is achieved that, if a target ratio for a given channel frequency is near an extreme value of one of the transfer functions and thus a small locking range can be provided, only, the target ratio for the same channel frequency on the other transfer function lies within a range that provides a rather large locking range.

Figure 4:
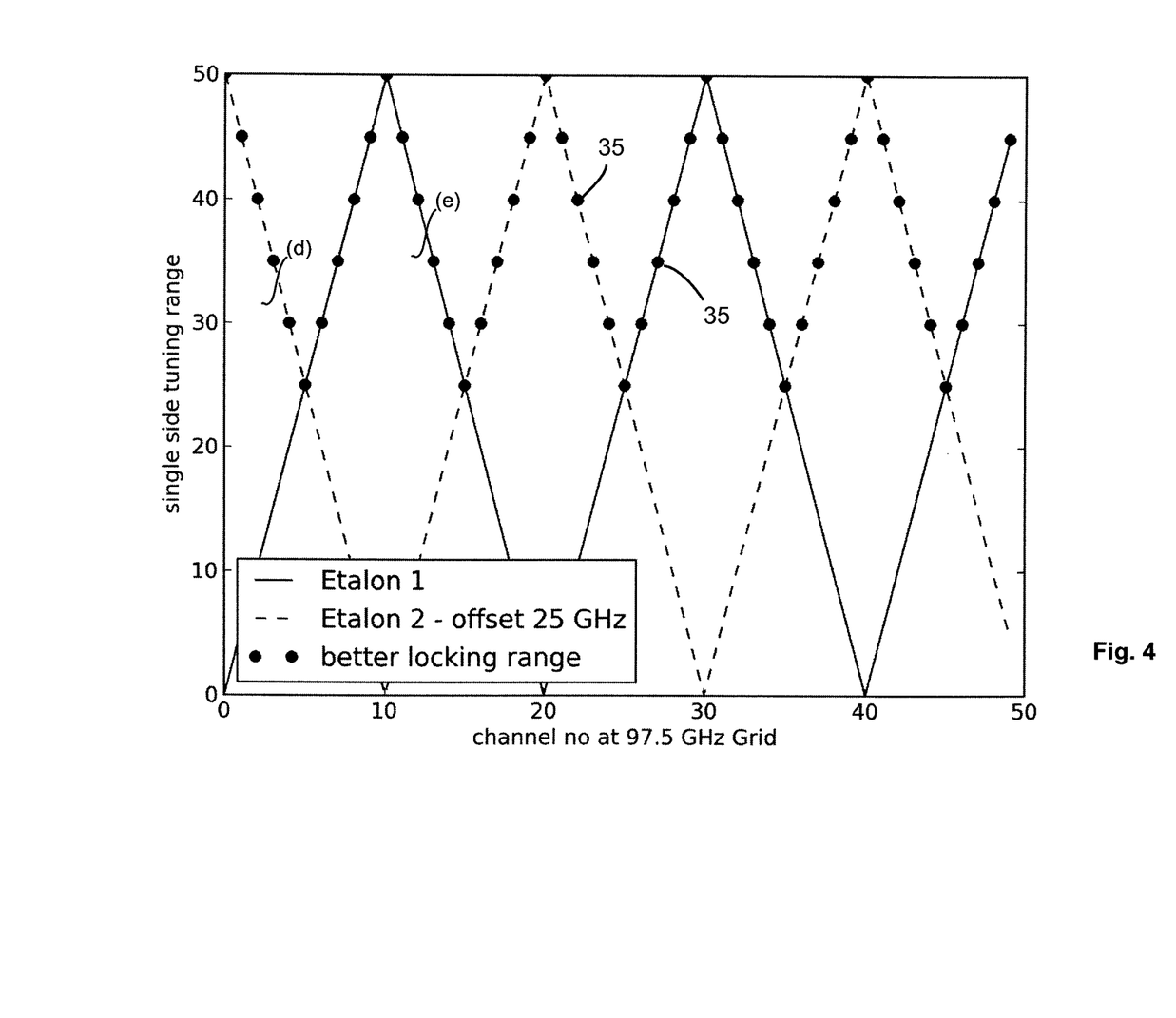

FIG. 4 shows how this effect can be used to determine, for each channel frequency, which of the two filter devices 25, 26 should be used in order to provide the larger locking range (as determined according to the method described above). The x-coordinate of the diagram in FIG. 4 represents the channel number of 50 channels spaced apart by 97.5 GHz and the y-coordinate represent the locking range in GHz. The zigzag curve (d) connects all points representing the locking range for the 50 channels provided by using the filter device 25 or the transfer function (a), respectively, and the zigzag curve (e) connects all points representing the locking range for the 50 channels provided by using the filter device 26 or the transfer function (c), respectively. The points 35 designate the best locking range, either provided by the filter device 25 or the filter device 26 for the 50 channels (or dedicated channel frequencies).

Thus, using the transfer characteristics of the optical filter devices 25, 26 which are offset by a given value, preferably by ¼ of the channel frequency spacing, it can be determined in advance which optical filter device 25, 26 shall be used for tuning the transmitter units such that the optical frequency of the respective transmit signal matches the dedicated optical channel frequency in order to guarantee the larger locking range. If the filter device 25 is to be used for the tuning process, the controller device 33 uses the values supplied by the detectors 31 and 29 for creating the frequency control or tuning signal $S_f$, whereas, if the filter device 26 is to be used for the tuning process, the controller device 33 uses the values supplied by the detectors 32 and 29 for creating the tuning signal $S_f$. Of course, it is sufficient to store only one target ratio per dedicated channel frequency within the controller device, namely, the target ratio that provides the larger locking range. Additionally, the controller device 33 must know which of the two filter devices 25, 26, together with the respective stored target ratio, is to be used for the tuning process and in which direction the frequency must be tuned if the measured ratio deviates up or down from the target ratio.

In order to effect the tuning of a selected transmitter unit 11, only this transmitter unit may be active, so that the respective transmit signal, only, is supplied to the optical frequency locking device. One transmitter unit after the other may be tuned and then switched off until all transmitters are tuned to the desired dedicated channel frequency. However, this tuning method would not allow to tune the transmitters 11 during operation.

In order to enable the tuning of a desired transmitter unit 11 also during operation (i.e. data transmission), the respective channel transmit signal created by the transmitter unit 11 to be tuned may be amplitude-modulated with a given low modulation depth and a rather low modulation frequency (as compared to the bit rate of the digital data transmission signal). The controller device 33 may then apply a phase sensitive filter process to the signals supplied by the detectors 29, 31, 32. In this way, the other channel transmit signals included within the tapped-off WDM transmit signal are filtered out from the detected signals.

Of course, if narrow locking ranges are acceptable (e.g. by using slower and more complicated tuning algorithms) or if only a small number of channels are to be tuned (so that the transfer function of the filter provides a sufficiently large single-sided tuning range as explained above for each dedicated channel frequency), the embodiment according to FIG. 1 may be simplified by using a single optical filter device and two optical detectors, only.

It is further within the scope of the invention to use more than two optical filter devices, each having a periodical transfer function that is off-grid as compared to the dedicated channel frequencies and all transfer functions being shifted versus each other by a predetermined frequency shift. Of course, for each further optical filter device an additional optical detector for detecting the filtered channel transmit signal may be provided.

In the following, a further alternative to define the (optimum) locking range will be described with reference to FIGS. 5 and 6.

Figure 5:
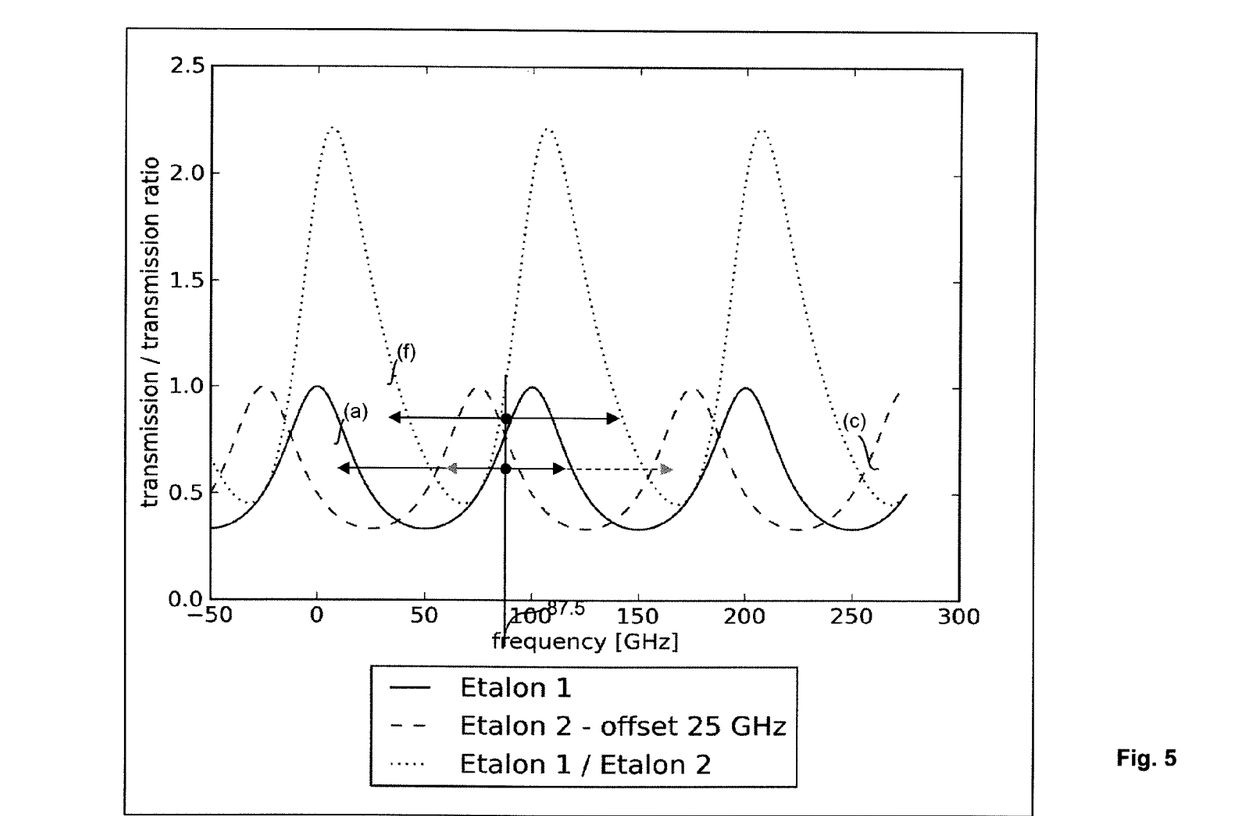
FIG. 5 comprises a diagram similar to FIG. 3 illustrating the additional use of the ratio of two output signals of two filter devices for the tuning process and the determination of a respective locking range.

FIG. 5 shows the normalized transfer functions OTF1=$P_{out1}/P_{in1}$ (curve (a)) and OTF2=$P_{out2}/P_{in2}$ (curve (c)) of the optical filter devices 25 and 26 in FIG. 1 as also shown in FIG. 3, where $P_{out1}$ and $P_{out2}$ denote the optical power of the respective optical signal filtered by the respective filter device 25, 26 and $P_{in1}$ and $P_{in2}$ denote the optical power of the optical signal supplied to the respective filter device 25, 26. Additionally, FIG. 5 shows the ratio RTF=OTF1/OTF2 (curve (f)) of the normalized optical transfer functions of the two optical filter devices 25, 26 which is proportional to the ratio of the optical powers $P_{out1}$ and $P_{out2}$ as the ratio of the optical input powers $P_{in1}$ and $P_{in2}$ is constant and essentially wavelength-independent. Thus, the controller device may calculate the ratio $P_{out1}/P_{out2}$ (or the reciprocal value) and store, for each of the dedicated optical channel frequencies of the channel transmit signal, a target ratio k. It is thus also possible to use the ratio $P_{out1}/P_{out2}$ or the ratio RTF, respectively, for tuning the frequency of the optical transmitter units 11 to match the respective dedicated channel frequency.

The locking range for each of the dedicated channel frequencies may be determined in the same way as described above in connection with the use of a single or more transfer functions of the optical filter devices. That means, the directly neighboring points of the ratio RTF having the same value as a given target value k for a given dedicated channel frequency are determined and the smaller frequency distance between the neighboring points and the given point (on the curve RTF as a function of the (normalized) optical frequency) is used to define a symmetrical locking range with the dedicated channel frequency as center of the locking range.

As shown in FIG. 5 for a normalized dedicated channel frequency f=87.5 GHz, the locking range that is determined using the ratio RTF (or $P_{out1}/P_{out2}$, respectively) may be larger than the locking ranges that are determined in the same way using each of the two transfer functions. The ratio RTF (or $P_{out1}/P_{out2}$, respectively) may thus be used to further improve the tuning method. For this purpose, the two or more transfer functions of the two or more optical filter devices are used in order to determine the respective locking ranges. In addition, the ratio RTF (or $P_{out1}/P_{out2}$, respectively) may be used to determine a further locking range. It is then possible to choose, for each of the dedicated channel frequencies, which of the ratios $P_{out1}/P_{in1}$, $P_{out2}/P_{in2}$ (i.e. which of the transfer functions) or $P_{out1}/P_{out2}$ grants the largest locking range and shall thus be best used for the respective tuning process (of course, the respective target ratio is used for the tuning process).

If more than two optical filter devices are used, it is, of course, possible to use different ratios of the optical powers of the respective filtered signals.

Figure 6:
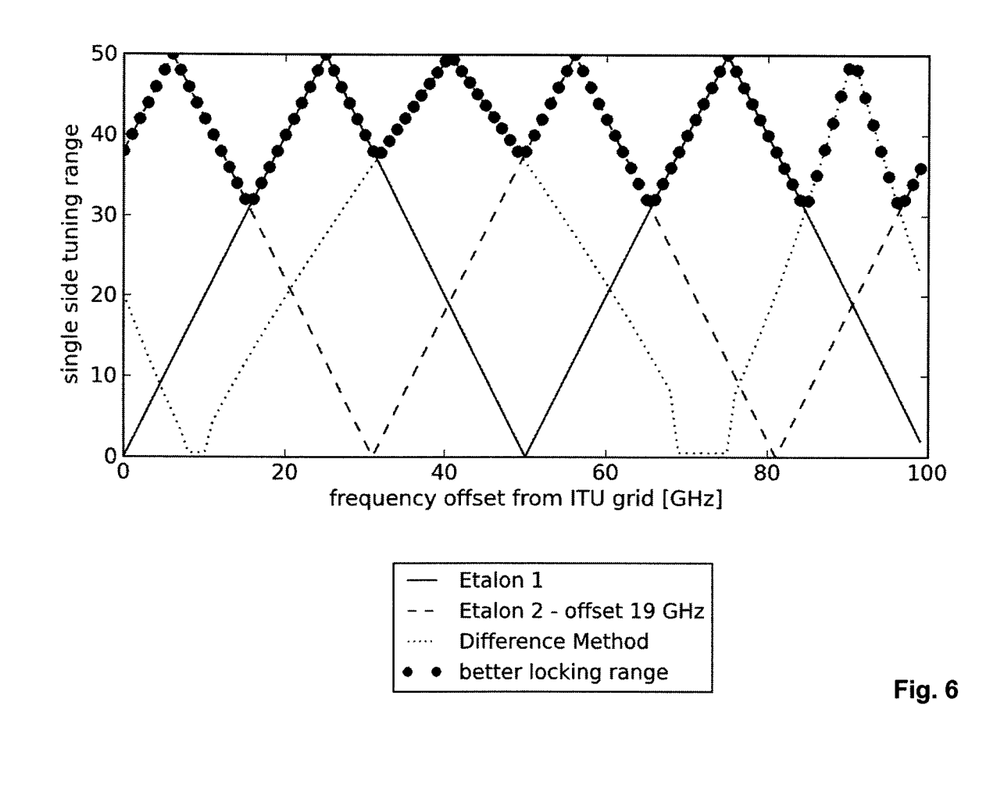
FIG. 6 comprises a diagram similar to FIG. 4 illustrating the advantageous choice of the ratio of output and input signals of the two filter devices or the ratio of the two output signals of the two filter devices for the tuning process.

FIG. 6 illustrates, for a locking device according to FIG. 1, in which two filter devices 25 are used having an identical spectral periodicity of 100 GHz but revealing a frequency shift of 19 GHz, how the ratio of the optical powers of the two filtered signals may advantageously be used for the tuning method. The dotted curve in FIG. 6 shows the single side tuning range (determined as described above) for the ratio of the two filtered (output) signals. The locking range between approx. 30 GHz and 50 GHz and between approx. 85 GHz and 95 GHz provided by evaluating the ratio of the two output signals is larger than the locking ranges provided by the respective transfer functions of the two filter devices 25, 26.

It is of course also possible to store, for each of the dedicated channel frequencies, not only the information which of the ratios of the optical powers shall be used for a respective tuning process, but also the information in which direction the actual frequency of the respective transmitter unit 11 is to be changed if the actual value of the ratio is either within the range corresponding to the half of the locking range left to the dedicated channel frequency or within the range corresponding to the half of the locking range right to the dedicated channel frequency.

As used herein, whether in the above description or the following claims, the terms "comprising," "including," "carrying," "having," "containing," "involving," and the like are to be understood to be open-ended, that is, to mean including but not limited to.

Any use of ordinal terms such as "first," "second," "third," etc., in the claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

The above described preferred embodiments are intended to illustrate the principles of the invention, but not to limit the scope of the invention. Various other embodiments and modifications to these preferred embodiments may be made by those skilled in the art without departing from the scope of the present invention.

LIST OF REFERENCE SIGNS 1 fiber-optic data transmission system
3 optical line terminal (OLT)
5 remote node (RN)
7 optical node unit (ONU 1 to ONU N)
9 optical frequency locking device
11 optical transmitter unit
13 optical multiplexing device
15 optical 1×2 splitter
17 input port of 9

19 band splitter
21 AWG for demultiplexing the WDM receive signal $S_{WDM,RX}$
23 receiver unit
25 optical filter device
26 optical filter device
27 points representing the ratio target values (curve (a))
28 points representing the ratio target values (curve (c))
29 optical reference detector
31 optical detector
32 optical detector
33 controller device
35 points representing the locking range to be used
$S_{WDM,TX}$ WDM transmit signal
$S_{WDM,RX}$ WDM receive signal
$S_f$ frequency control

The invention claimed is:

1. An optical frequency locking method for tuning each of a plurality of narrow-band optical channel transmit signals to a respective dedicated optical channel frequency, the channel transmit signals having arbitrary channel frequency spacings, the method comprising, for each channel transmit signal, the steps of:
   (a) tapping-off a portion of the optical power of the channel transmit signal to be tuned and filtering the tapped-off channel transmit signal using at least one optical filter device having a periodic transfer function, at least one of the channel frequency spacings of the channel transmit signals being unequal to the periodicity of the transfer function;
   (b) monitoring, as an optical input signal, the optical power of the channel transmit signal supplied to the at least one optical filter device, and monitoring, as an optical output signal, the optical power of the filtered channel transmit signal; and
   (c) tuning, within a predetermined locking range for the dedicated optical channel frequency, the optical frequency of the respective channel transmit signal such that a predetermined value for a target ratio is reached, the target ratio comprising the ratio of the optical output signal and the optical input signal corresponding to the respective dedicated optical channel frequency, wherein the predetermined locking range is defined by,
      (i) determining a first spectral distance between the respective dedicated channel frequency and a first neighboring point at a lower frequency having the same value of the ratio of the optical output and input signal as the predetermined value of the target ratio and determining a second spectral distance between the respective dedicated channel frequency and a second neighboring point at a higher frequency having the same value of the ratio of the optical output and input signal as the predetermined value of the target ratio, and
      (ii) using as the locking range either the whole range between the first and second neighboring points, or the range between the frequencies defined by the respective dedicated optical channel frequency plus and minus the smaller one of the first and second spectral distance.

2. The method of claim 1, wherein the predetermined value of the target ratio is either (i) calculated using the transfer function of the at least one optical filter device and the frequency spectrum of the transmit signal at the respective dedicated optical channel frequency, or (ii) measured, during a calibration process, using the at least one optical filter device and the channel transmit signal tuned to the respective dedicated optical channel frequency.

3. An optical frequency locking device for tuning each of a plurality of narrow-band optical channel transmit signals to a respective dedicated optical channel frequency, the channel transmit signals having arbitrary frequency spacings, the device comprising:
   (a) at least two optical filter devices, each having a periodic transfer function, at least one of the channel frequency spacings of the channel transmit signals being unequal to the periodicity of the transfer functions and the transfer functions being different from each other;
   (b) an optical splitter arrangement adapted to tap off a portion of the power of the channel transmit signal to be tuned and to split the tapped-off channel transmit signal into a first channel transmit signal and into at least two second channel transmit signals each of the at least two second channel transmit signals being supplied to a respective one of the at least two optical filter devices;
   (c) a first detector means adapted to detect, as an input signal, absolute or relative values of the optical power of the first channel transmit signal, and at least two second detector means, each adapted to detect, as an output signal, absolute or relative values of the optical power of the second channel transmit signal filtered by a respective one of the at least two optical filter devices; and
   (d) a controller device adapted to receive, from the first and second detector means, the detected values of the input and output signals, and to create, for an optical transmitter unit creating the channel transmit signal, a tuning signal such that the optical frequency of the channel transmit signal is tuned, within a predetermined locking range for the respective dedicated optical channel frequency, such that a predetermined value for a target ratio is reached, the target ratio comprising the ratio of the output signal and the input signal corresponding to the respective dedicated optical channel frequency, wherein the controller device selects, according to stored, calculated or received information for the respective dedicated optical channel frequency, which of the at least two optical filter devices and which of the input or output signals are to be used for tuning the optical transmitter unit, and wherein the controller device is adapted to create the tuning signal for the optical transmitter unit such that the optical frequency of the channel transmit signal is tuned to a value at which the predetermined value for the target ratio corresponding to the respective dedicated optical channel frequency is reached.

4. The optical frequency locking device of claim 3, wherein the controller device is adapted to control the tuning process such that, at the beginning of the tuning process, the optical frequency of the channel transmit signal is tuned to an initial value lying within the predetermined locking range for the respective dedicated optical channel frequency.

5. The optical frequency locking device of claim 3, wherein the predetermined value for the target ratio for each dedicated optical channel frequency and each of the at least two optical filter devices is stored within the controller device or wherein the controller device calculates these values based on stored information concerning the transfer function of the at least two optical filter devices.

6. The optical frequency locking device of claim 3, wherein the predetermined locking range for each dedicated channel frequency and each of the at least two optical filter devices is stored within the controller device or wherein the controller device calculates these values based on stored information concerning the transfer function of the at least two optical filter devices.

7. The optical frequency locking device of claim 3, wherein the controller device selects, according to stored, calculated or received information for the respective dedicated optical channel frequency, that instead of a selected one of the ratios of the output and input signals of the two optical filter devices, the ratio of a first and a second output signal is used for tuning the optical transmitter unit.

8. The optical frequency locking device of claim 3, wherein the periodic transfer functions of the at least two optical filter devices have essentially the same periodicity and are shifted versus each other by a predetermined frequency shift, the frequency shift lying within a range of 15 to 35 percent of the channel spacing.

9. The optical frequency locking device of claim 3, wherein the tapped-off channel transmit signal is included within a WDM transmit signal, wherein a means adapted to effect an amplitude modulation of the channel transmit signal to be tuned with a predetermined given modulation frequency and a given modulation depth is provided, and wherein the first and second detector devices are adapted to detect the channel transmit signal to be tuned and the filtered channel transmit signal in a phase-sensitive manner.

10. An optical frequency locking method for tuning each of a plurality of narrow-band optical channel transmit signals to a respective dedicated optical channel frequency, the channel transmit signals having arbitrary channel frequency spacings, the method comprising, for each channel transmit signal, the steps of:
  (a) tapping-off a portion of the optical power of the channel transmit signal to be tuned;
  (b) supplying the tapped-off portion of the optical power of the channel transmit signal to be tuned to each of at least two optical filter devices, the respective tapped-off channel transmit signal being filtered by the corresponding optical filter device, each of the at least two optical filter devices having a respective periodic transfer function, at least one of the channel frequency spacings of the channel transmit signals being unequal to the periodicity of each of the transfer functions and the transfer functions being different from each other;
  (c) monitoring as a first optical output signal the optical power of the tapped-off channel transmit signal filtered by a first one of the optical filter devices and monitoring as a second optical output signal the optical power of the tapped-off channel transmit signal filtered by a second one of the optical filter devices; and
  (d) tuning, within a predetermined locking range for the dedicated optical channel frequency, the optical frequency of the respective channel transmit signal such that a predetermined value for a target ratio is reached, the target ratio comprising the ratio of the first and second output signals corresponding to the respective dedicated optical channel frequency.

11. The method of claim 10, wherein the periodic transfer functions of the at least two optical filter devices have essentially the same periodicity and are shifted versus each other by a predetermined frequency shift.

12. The method of claim 11, wherein the predetermined locking range is defined by:
  (a) determining a first spectral distance between the respective dedicated optical channel frequency and a first neighboring point at a lower frequency having the same value of the ratio of the first and second optical output signals as the predetermined value of the target ratio and determining a second spectral distance between the respective dedicated optical channel frequency and a second neighboring point at a higher frequency having the same value of the ratio of the first and second optical output signals as the predetermined value of the target ratio; and
  (b) using as the locking range either:
    (i) the whole range between the first and second neighboring points, or
    (ii) the range between the frequencies defined by the respective dedicated optical channel frequency plus and minus the smaller one of the first and second spectral distance.

* * * * *